(12) United States Patent
Lee et al.

(10) Patent No.: US 11,770,931 B2
(45) Date of Patent: Sep. 26, 2023

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Ki Hong Lee, Icheon-si (KR); Hwal Pyo Kim, Icheon-si (KR); Seung Woo Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/721,096

(22) Filed: Apr. 14, 2022

(65) Prior Publication Data

US 2022/0246641 A1  Aug. 4, 2022

Related U.S. Application Data

(63) Continuation of application No. 16/942,478, filed on Jul. 29, 2020, now Pat. No. 11,309,330.

(30) Foreign Application Priority Data

Feb. 20, 2020 (KR) .......................... 10-2020-0021275

(51) Int. Cl.
*H10B 43/27* (2023.01)
*H01L 29/423* (2006.01)

(52) U.S. Cl.
CPC ....... *H10B 43/27* (2023.02); *H01L 29/42368* (2013.01)

(58) Field of Classification Search
None
See application file for complete search history.

(56) References Cited

U.S. PATENT DOCUMENTS

| | | | |
|---|---|---|---|
| 10,593,695 B1 * | 3/2020 | Kim | ..................... H01L 29/4234 |
| 2016/0118403 A1 * | 4/2016 | Yoo | ................... H01L 21/31111 |
| | | | 438/269 |
| 2018/0219021 A1 | 8/2018 | Daycock et al. | |

FOREIGN PATENT DOCUMENTS

| KR | 101792778 B1 | 11/2017 |
|---|---|---|
| KR | 1020180045975 A | 5/2018 |

* cited by examiner

*Primary Examiner* — Hsien Ming Lee
(74) *Attorney, Agent, or Firm* — WILLIAM PARK & ASSOCIATES LTD.

(57) ABSTRACT

A semiconductor device includes: a stack structure including insulating layers and conductive layers, which are alternately stacked; a channel structure penetrating the stack structure; data storage patterns respectively interposed between the conductive layers and the channel structure; blocking patterns respectively interposed between the conductive layers and the data storage patterns; insulating patterns respectively interposed between the insulating layers and the channel structure; and insulative liners interposed between the insulating layers and the insulating patterns, the insulative liners respectively surrounding the insulating patterns.

17 Claims, 13 Drawing Sheets

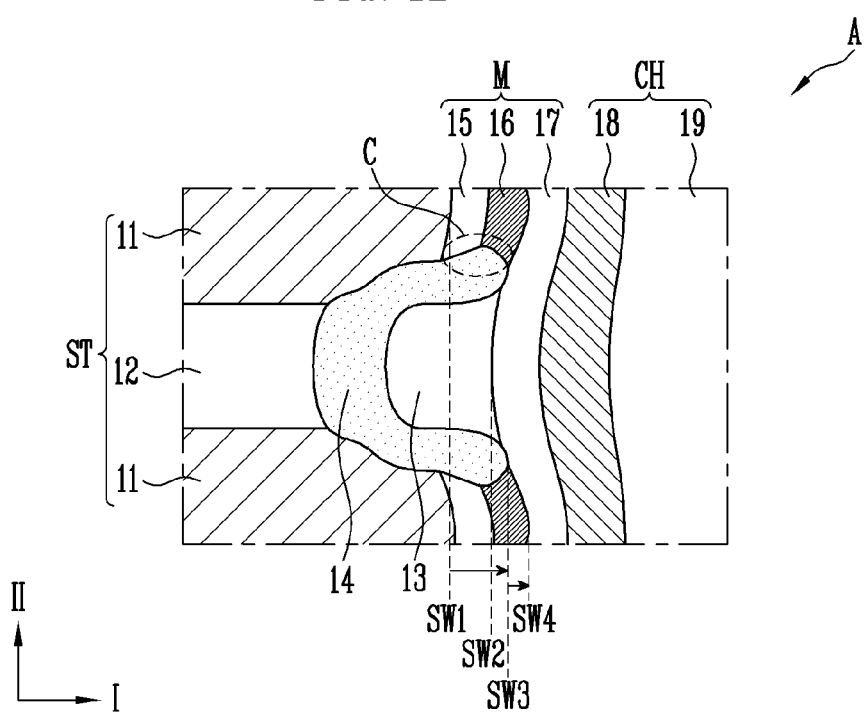

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 16/942,478, filed on Jul. 29, 2020, and claims priority under 35 U.S.C. § 119(a) to Korean patent application number 10-2020-0021275, filed on Feb. 20, 2020, in the Korean Intellectual Property Office, the entire disclosure of which is incorporated herein by reference.

BACKGROUND

1. Technical Field

The present disclosure generally relates to an electronic device, and more particularly, to a semiconductor device and a manufacturing method of the semiconductor device.

2. Related Art

A nonvolatile memory device is a memory device in which stored data is maintained even when a supply of power is interrupted. As the improvement of the degree of integration of two-dimensional nonvolatile memory devices, with memory cells that are formed over a semiconductor substrate in the form of a single layer, has reached its limit, three-dimensional nonvolatile memory devices, in which memory cells are formed in a vertical direction over a semiconductor substrate, have been proposed.

A three-dimensional memory device includes interlayer insulating layers and gate electrodes, which are alternately stacked, and channel layers penetrating the interlayer insulating layers and the gate electrodes, and memory cells are stacked along the channel layers. Various structures and manufacturing methods have been developed so as to improve the operational reliability of three-dimensional nonvolatile memory devices.

SUMMARY

In accordance with an aspect of the present disclosure, there is provided a semiconductor device including: a stack structure including insulating layers and conductive layers, which are alternately stacked; a channel structure penetrating the stack structure; data storage patterns respectively interposed between the conductive layers and the channel structure; blocking patterns respectively interposed between the conductive layers and the data storage patterns; insulating patterns respectively interposed between the insulating layers and the channel structure; and insulative liners interposed between the insulating layers and the insulating patterns, the insulative liners respectively surrounding the insulating patterns.

In accordance with another aspect of the present disclosure, there is provided a semiconductor device including: a stack structure including insulating layers and conductive layers, which are alternately stacked; a channel structure penetrating the stack structure; insulating patterns respectively interposed between the insulating layers and the channel structure, the insulating patterns protruding farther toward the channel structure than the conductive layers; data storage patterns respectively interposed between the conductive layers and the channel structure, the data storage patterns protruding farther toward the channel structure than the insulating patterns; and blocking patterns respectively interposed between the conductive layers and the data storage patterns.

In accordance with still another aspect of the present disclosure, there is provided a method of manufacturing a semiconductor device, the method including: forming a stack structure including first sacrificial layers and insulating layers, which are alternately stacked; forming a first opening penetrating the stack structure; forming second openings by etching the insulating layers; forming protective patterns on the first sacrificial layers; forming a data storage layer in the first opening and the second openings; forming insulating patterns in the second openings; forming a channel structure in the first opening; forming third openings exposing the protective patterns by selectively removing the first sacrificial layers; removing the protective patterns to partially expose the data storage layer; and forming insulative liners respectively surrounding the insulating patterns by partially oxidizing the data storage layer through the third openings.

In accordance with still another aspect of the present disclosure, there is provided a method of manufacturing a semiconductor device, the method including: forming a stack structure including first sacrificial layers and insulating layers, which are alternately stacked; forming a first opening penetrating the stack structure; forming second openings by etching the insulating layers; forming blocking patterns on the first sacrificial layers; forming a data storage layer in the first opening and the second openings; forming insulating patterns in the second openings; forming a channel structure in the first opening; forming third openings by selectively removing the first sacrificial layers; etching the insulating layers to partially expose the data storage layer through the third openings; and forming insulative liners respectively surrounding the insulating patterns by partially oxidizing the data storage layer through the third openings.

BRIEF DESCRIPTION OF THE DRAWINGS

Example embodiments are described hereinafter with reference to the accompanying drawings; however, they may be embodied in different forms and should not be construed as limited to the embodiments set forth herein. Rather, these embodiments are provided so that this disclosure will be enabling to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A and 1B are views illustrating a structure of a semiconductor device in accordance with an embodiment of the present disclosure.

DETAILED DESCRIPTION

The specific structural or functional description disclosed herein is merely illustrative for the purpose of describing embodiments according to the concept of the present disclosure. Embodiments according to the concept of the present disclosure can be implemented in various forms, and should not be construed as limited to the embodiments set forth herein.

Various embodiments are directed to a semiconductor device having a stable structure and improved characteristics. Some embodiments are directed to a manufacturing method of such a semiconductor device.

Figure 1A:
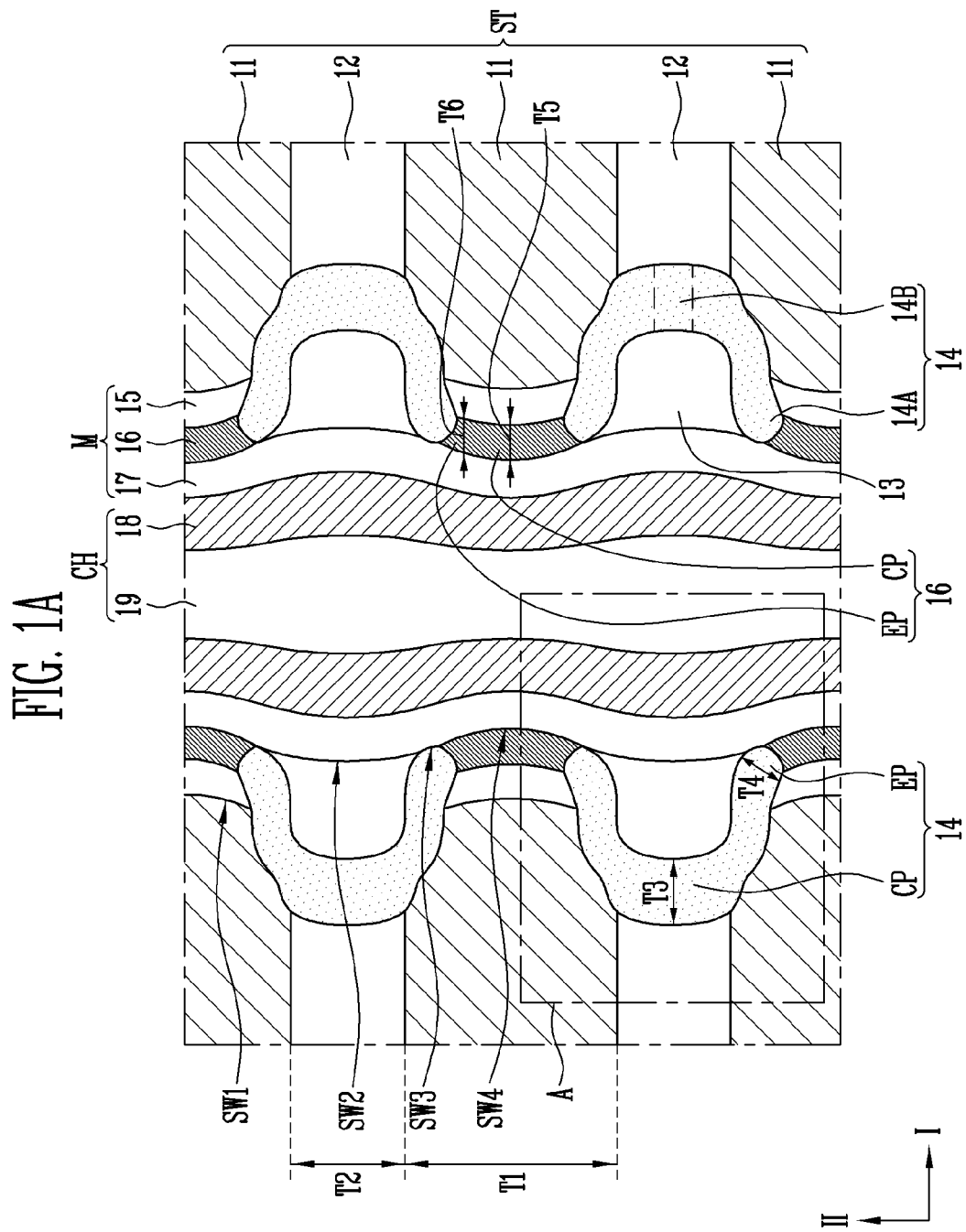

FIGS. 1A and 1B are views illustrating a structure of a semiconductor device in accordance with an embodiment of the present disclosure. FIG. 1B is an enlarged view of region A shown in FIG. 1A.

Referring to FIG. 1A, the semiconductor device may include a stack structure ST, a memory layer M, a channel structure CH, insulating patterns 13, and insulative liners 14.

The stack structure ST may include conductive layers 11 and insulating layers 12, which are alternately stacked. The conductive layers 11 may be gate electrodes of a select transistor, a memory cell, and the like. The conductive layers 11 may include a conductive material such as poly-silicon, tungsten, or metal. The insulating layers 12 are used to insulate the stacked conductive layers 11 from each other. The insulating layers 12 may include an insulating material such as oxide or nitride.

Each of the conductive layers 11 may have a first thickness T1 defined in a second direction II. In each of the conductive layers 11, a thickness of a portion of the conductive layer 11 closer to the channel structure CH may be thinner than the thickness T1 of the portion spaced apart from the channel structure CH. In each of the conductive layers 11, a portion interposed between the insulative liners 14 may have a thickness thinner than that of a portion interposed between the insulating layers 12. An interface between the first conductive layers 11 and the insulative liners 14 may be one defined by an oxidation process. The interface may include a curved surface.

Each of the insulating layers 12 may have a second thickness T2 defined in the second direction II. The insulating layers 12 may have a thickness thinner than that of the conductive layers 11 (T2<T1). An interface between the insulating layers 12 and the insulative liners 14 may include a curved surface.

The channel structure CH may penetrate the stack structure ST. The channel structure CH may expand in the second direction II. The channel structure CH may include a channel layer 18, and further include a gap fill layer 19. The channel layer 18 may be a region in which a channel of a select transistor, a memory cell, or the like is formed. The channel layer 18 may include a semiconductor material such as silicon (Si) or germanium (Ge) or include a nano-structure material such as nano dots, nano tubes, or graphene. The gap fill layer 19 may be formed in the channel layer 18 and include an insulating material such as oxide.

The memory layer M may be interposed between the stack structure ST and the channel structure CH. The memory layer M may include at least one of blocking patterns 15, data storage patterns 16, and a tunnel insulating layer 17. The tunnel insulating layer 17 may be formed to surround a sidewall of the channel structure CH. The tunnel insulating layer 17 may be a layer through which charges tunnel by F-N tunneling, etc., and include an insulating material such as oxide or nitride. The tunnel insulating layer 17 may be in contact with the data storage patterns 16 and the insulating patterns 13. Also, the tunnel insulating layer 17 may be in contact with the insulative liners 14.

The data storage patterns 16 may be respectively interposed between the conductive layers 11 and the channel structure CH. The data storage patterns 16 may be formed to surround the tunnel insulating layer 17. Each of the data storage patterns 16 may include a first surface facing the tunnel insulating layer 17, a second surface facing the blocking pattern 15, and a third surface facing the insulative liner 14. At least one of the first to third surfaces may include a curved surface. The first surface or the second surface may include a curved surface protruding toward the channel structure CH. The third surface may include a curved surface depressed into the storage pattern 16. The data storage patterns 16 may include a floating gate, a charge trap material, poly-silicon, nitride, a variable resistance material, a phase change material, a nano structure, etc.

The data storage patterns 16 may have a thickness defined in a first direction I. Also, each of the data storage patterns 16 may have different thicknesses depending on regions. Each of the data storage patterns 16 may include both end portions EP in contact with the insulative liners 14 and a central portion CP located between both the end portions EP. A thickness T6 of the end portion EP and a thickness T5 of the central portion CP may be different from each other. The central portion CP may be thicker than the end portion EP (T5>T6). When the end portion EP or the central portion CP has a non-uniform thickness, a thickness difference may be determined by comparing thickest thicknesses or average thicknesses of the end portion EP and the central portion CP with each other.

The blocking patterns 15 may be respectively interposed between the conductive layers 11 and the data storage patterns 16. The blocking patterns 15 may be formed to respectively surround the data storage patterns 16. The blocking patterns 15 may prevent charges from moving to the conductive layers 11 and include a high dielectric constant material such as aluminum oxide ($Al_2O_3$).

The insulating patterns 13 may be respectively interposed between the insulating layers 12 and the channel structure CH. The insulating patterns 13 may be located respectively corresponding to the insulating layers 12, and be located at the substantially same level as the insulating layers 12. The insulating patterns 13 may be in contact with the tunnel insulating layer 17.

The insulative liners 14 may be interposed between the insulating layers 12 and the insulating patterns 13. Each of the insulative liners 14 may be expanded between the conductive layers 11 and the insulating patterns 13, between the blocking patterns 15 and the insulating patterns 13, and between the data storage patterns 16 and the insulating patterns 13. The insulative liners 14 may be formed to respectively surround the insulating patterns 13. The insulative liners 14 may include an insulating material such as oxide.

The insulative liners 14 may be ones formed by partially oxidizing a data storage layer. Therefore, the insulative liners 14 may include a data storage material which is not oxidized but remains. For example, each of the insulative liners 14 may include an oxide layer 14A and a charge trap material 14B included in the oxide layer 14A. An interface between the insulative liners 14 and the data storage patterns 16 may be one defined by an oxidation process. Therefore, the interface may include a curved surface.

The insulative liners 14 may be formed through a process different from that of the tunnel insulating layer 17 or the blocking patterns 15, and have a property different from that of the tunnel insulating layer 17 or the blocking patterns 15. The tunnel insulating layer 17 may correspond to a layer formed through a deposition process, and the insulative liners 14 may correspond to a layer formed through an oxidation process. The blocking patterns 15 may correspond to a layer formed by oxidizing poly-silicon, and the insulative liners 14 may correspond to a layer formed by oxidizing a charge trap material such as nitride. The insulative liners 14 may have an etching rate different from that of the tunnel insulating layer 17 or the blocking patterns 16. The insulative liners 14 may have an etching rate lower than that of the tunnel insulating layer 17 or the blocking patterns 16.

Each of the insulative liners 14 may have different thicknesses depending on regions. Each of the insulative liners 14 may include both end portions EP in contact with the memory layer M and a central portion CP in contact with the insulating layer 12. A thickness T4 of the end portion EP and a thickness T3 of the central portion CP may be different from each other. The central portion CP may be thicker than the end portion EP (T3>T4). When the end portion EP or the central portion CP has a non-uniform thickness, a thickness difference may be determined by comparing thickest thicknesses or average thicknesses of the end portion EP and the central portion CP with each other.

Referring to FIGS. 1A and 1B, the conductive layers 11 may include a first sidewall SW1 in contact with the blocking patterns 15. The insulating patterns 13 may include a second sidewall SW2 in contact with the tunnel insulating layer 17. The second sidewall SW2 may be an etched surface. The insulative liners 14 may include a third sidewall SW3 in contact with the tunnel insulating layer 17 and the data storage patterns 16. The third sidewall SW3 may be a surface defined by an oxidation process. The data storage patterns 16 may include a fourth sidewall SW4 in contact with the tunnel insulating layer 17. The fourth sidewall SW4 may be a surface defined by a deposition process.

The first to fourth sidewalls SW1 to SW4 may be located to be spaced apart from each other in the first direction I. The second sidewall SW2 may protrude farther toward the channel structure CH than the first sidewall SW1. The third sidewall SW3 may protrude farther toward the channel structure CH than the first sidewall SW1 and the second sidewall SW2. The fourth sidewall SW4 may protrude farther toward the channel structure CH than the second sidewall SW2 and the third sidewall SW3. When the first sidewall SW1, the second sidewall SW2, the third sidewall SW3, or the fourth sidewall SW4 includes a curved surface, positions between the sidewalls may be compared with respect to a point most protruding toward the channel structure CH in the first direction I. The first direction I may be parallel to a surface of a base such as a substrate. The first direction I and the second direction II may intersect each other.

Because the insulating patterns 13 and the insulative liners 14 protrude farther than the conductive layers 11, a space may be defined between the insulating patterns 13 and the insulative liners 14, which are adjacent in the second direction II. In addition, the memory layer M may be formed to fill the space. The blocking patterns 15 and the data storage patterns 16 may fill a space between the insulating patterns 13 or a space between the insulative liners 14.

Concave portions C may be defined between the blocking patterns 15 and the data storage patterns 16. An interface between the blocking patterns 15 and the insulative liners 14 and an interface between the data storage patterns 16 and the insulative liners 14 are connected in a "V" or "U" shape, so that the concave portion C is defined. The concave portions C may be filled with the insulative liners 14.

According to the structure described above, a memory cell or a select transistor may be located at intersections of the channel structure CH and the conductive layers 11. Memory cells and select transistors, which share the channel structure CH, may constitute one memory string. The memory string may include at least one drain select transistor, memory cells, and at least one source select transistor.

In addition, the data storage patterns 16 are isolated from each other by the insulating patterns 13 and the insulative liners 14. Thus, the data storage patterns 16 of the stacked memory cells are isolated from each other, and data retention characteristics can be improved.

Figure 2A:
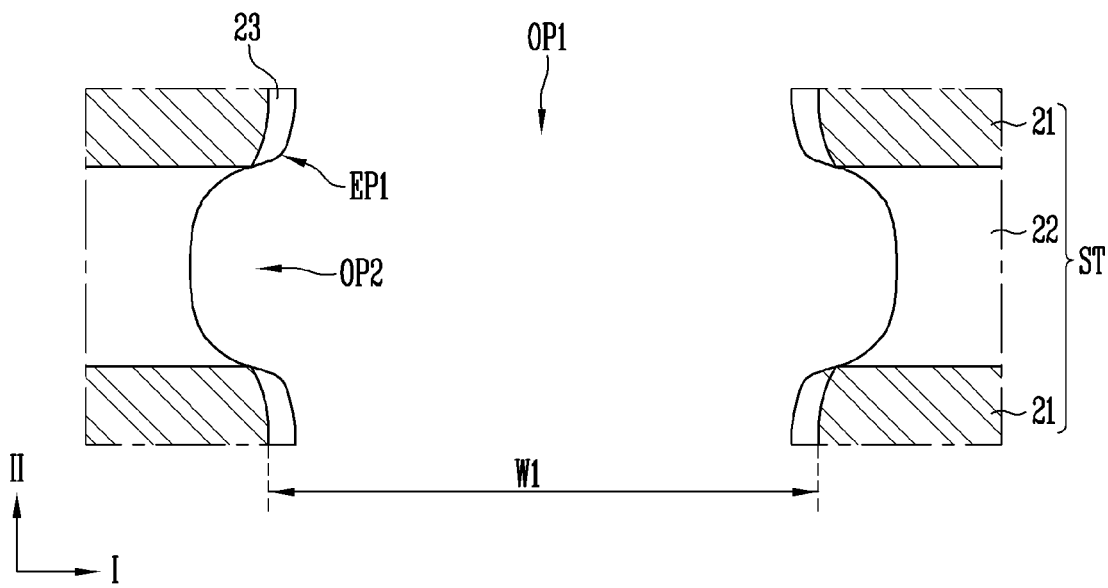
FIGS. 2A to 2Q are views illustrating a manufacturing method of the semiconductor device in accordance with an embodiment of the present disclosure.
Figure 2B:
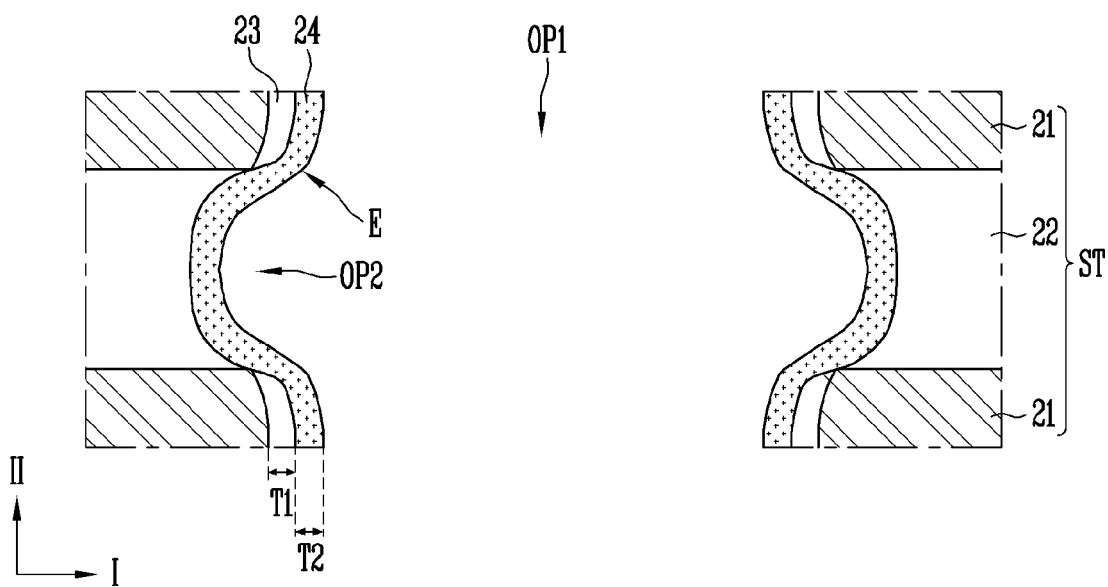
Figure 2C:
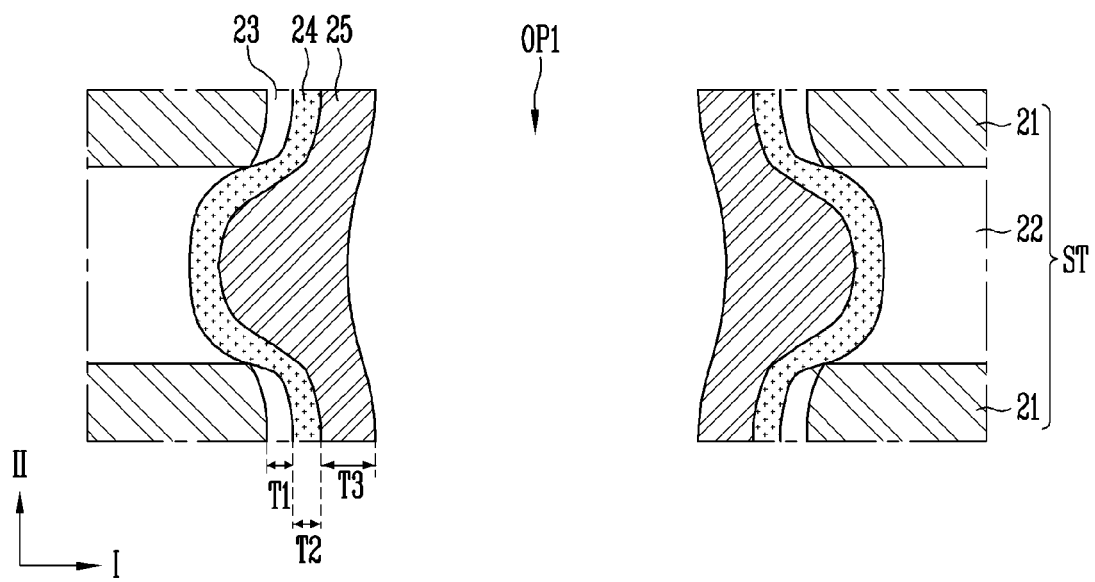
Figure 2D:
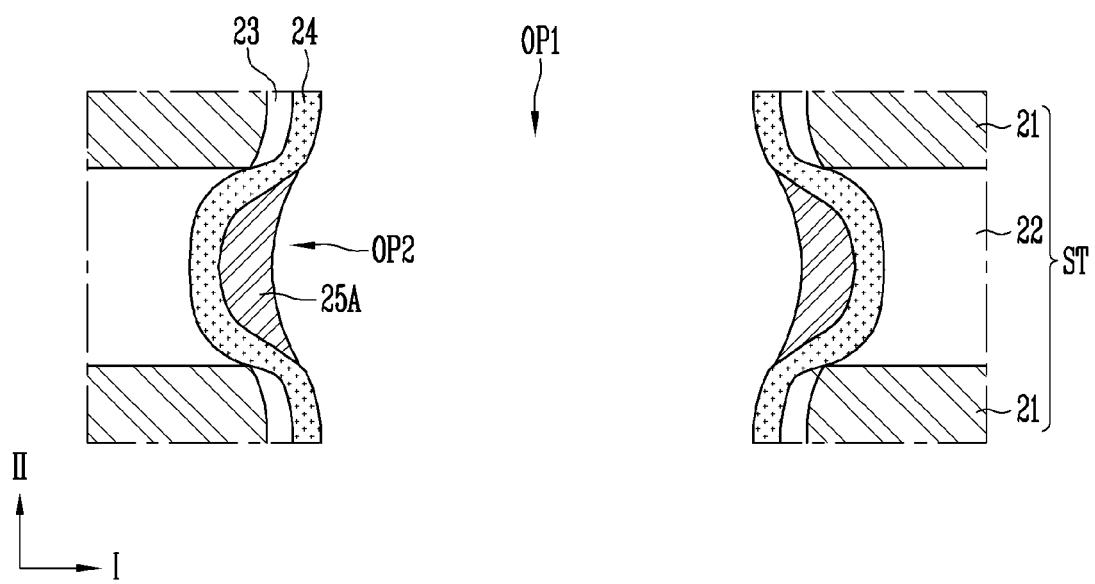
Figure 2E:
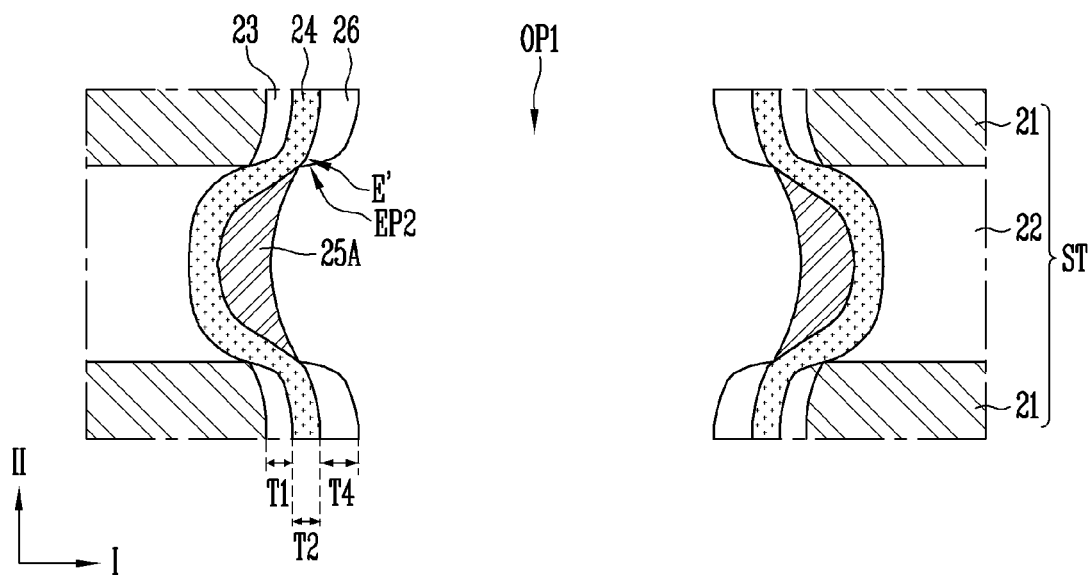
Figure 2F:
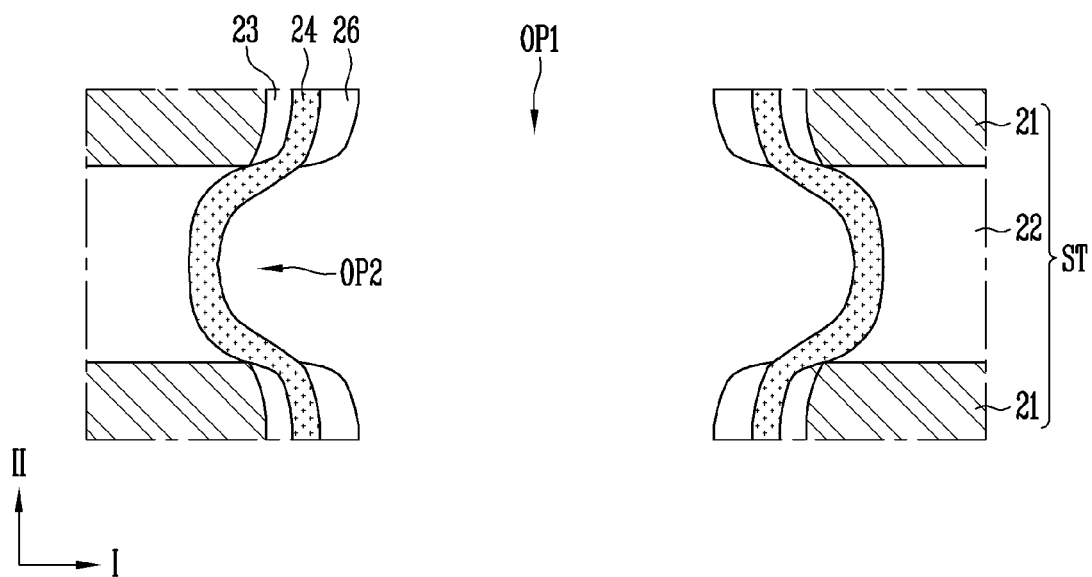
Figure 2G:
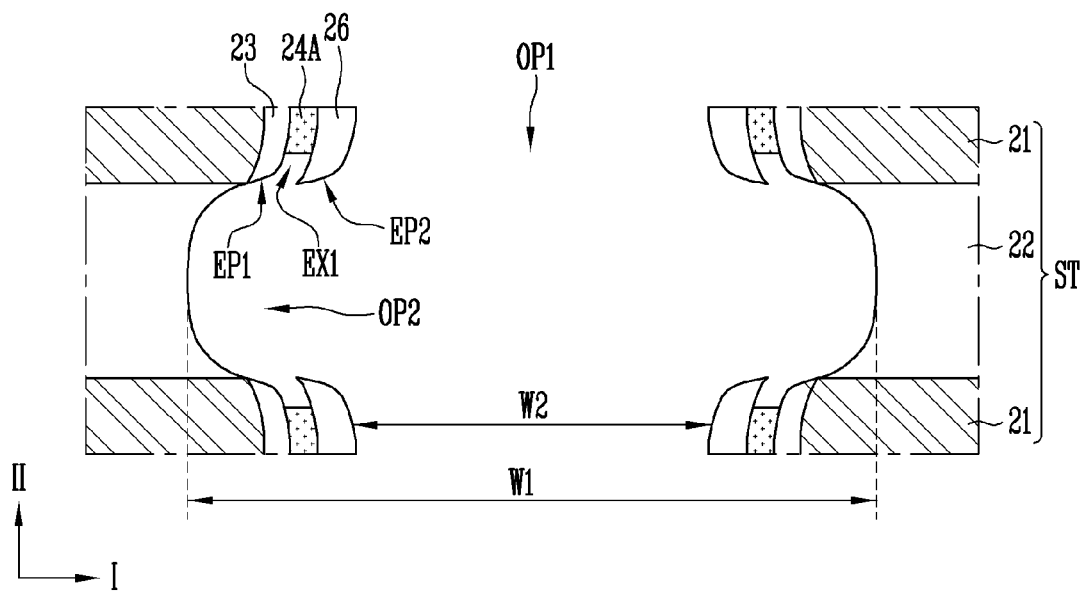
Figure 2H:
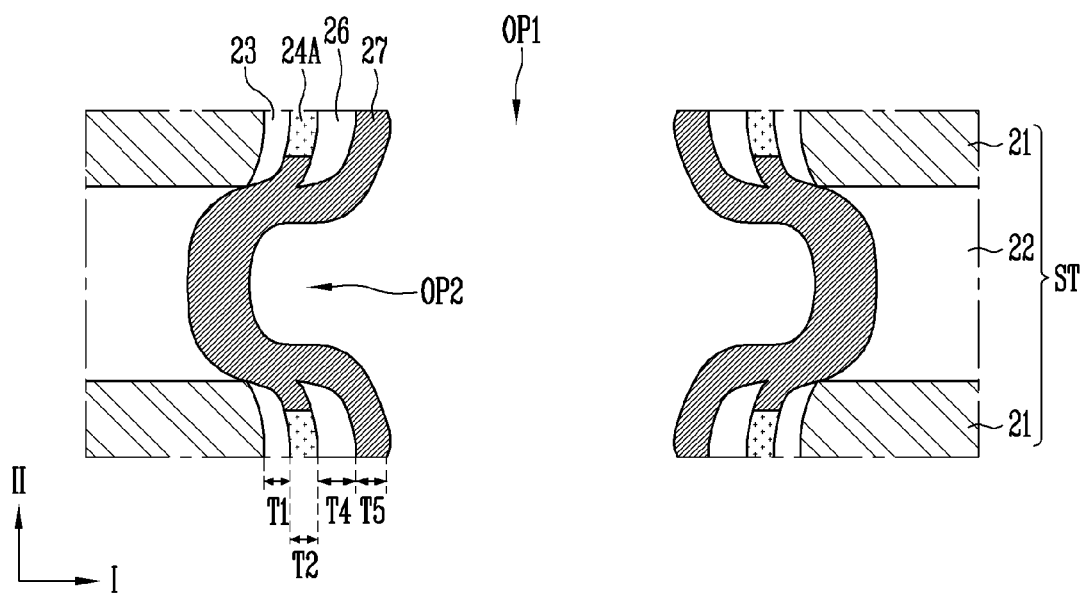
Figure 2I:
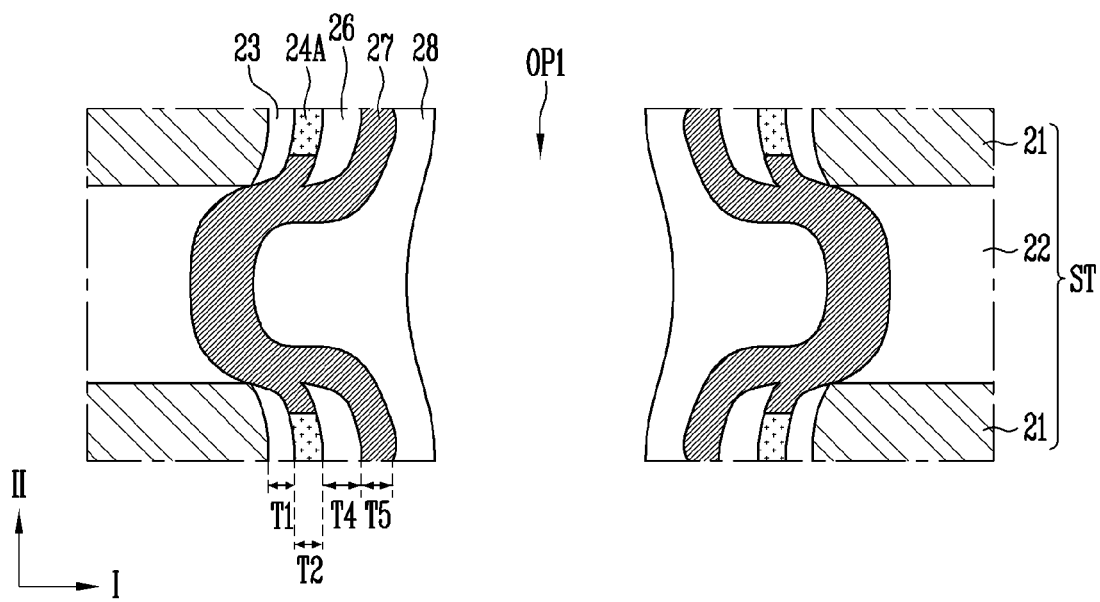
Figure 2J:
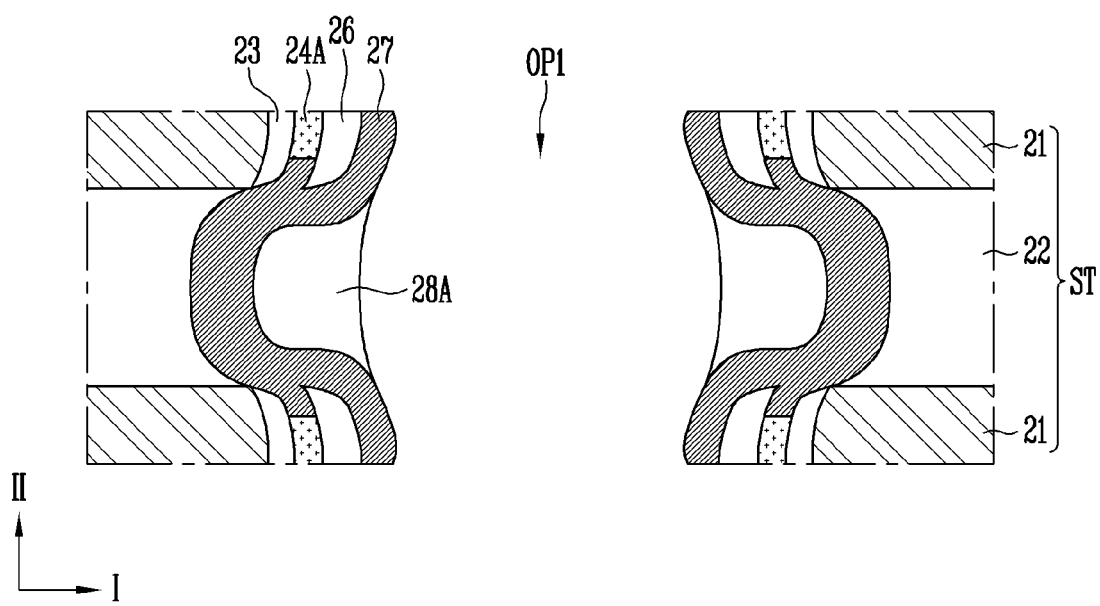
Figure 2K:
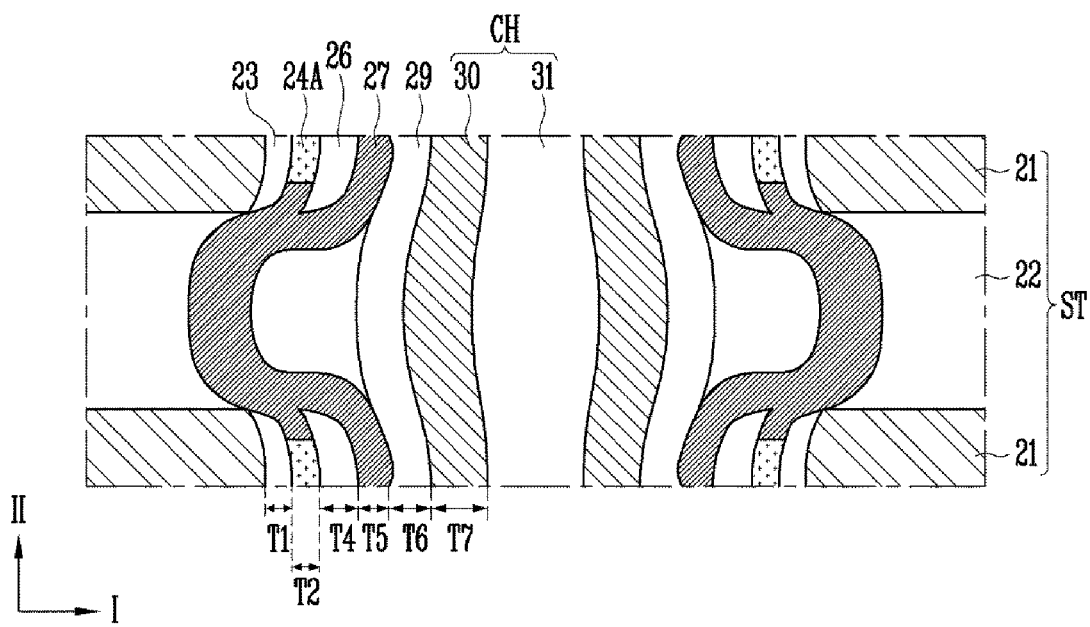
Figure 2L:
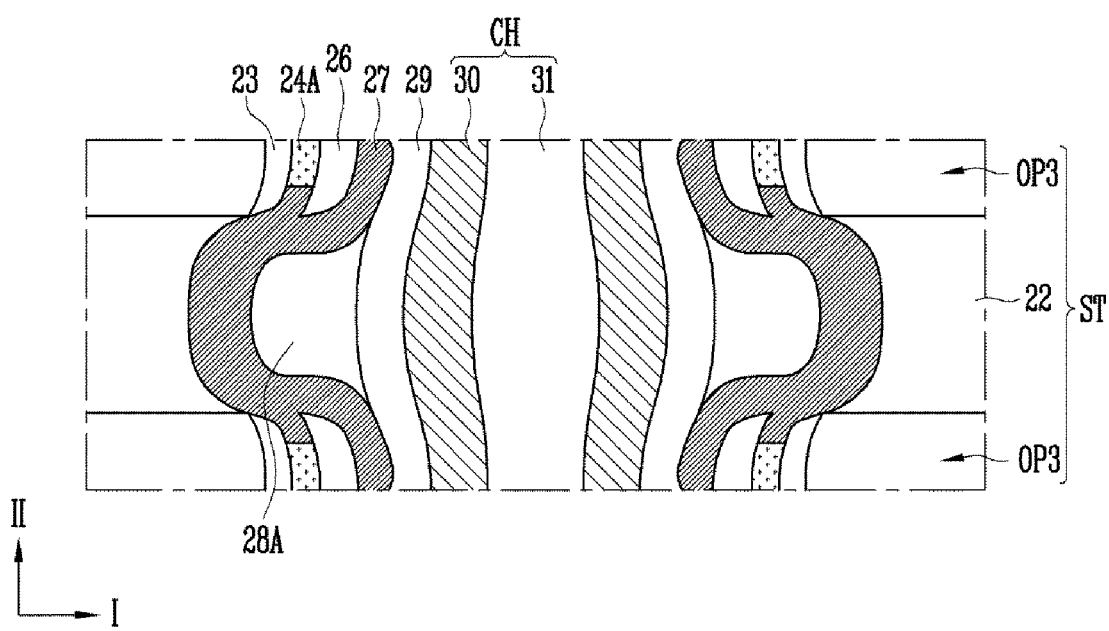
Figure 2M:
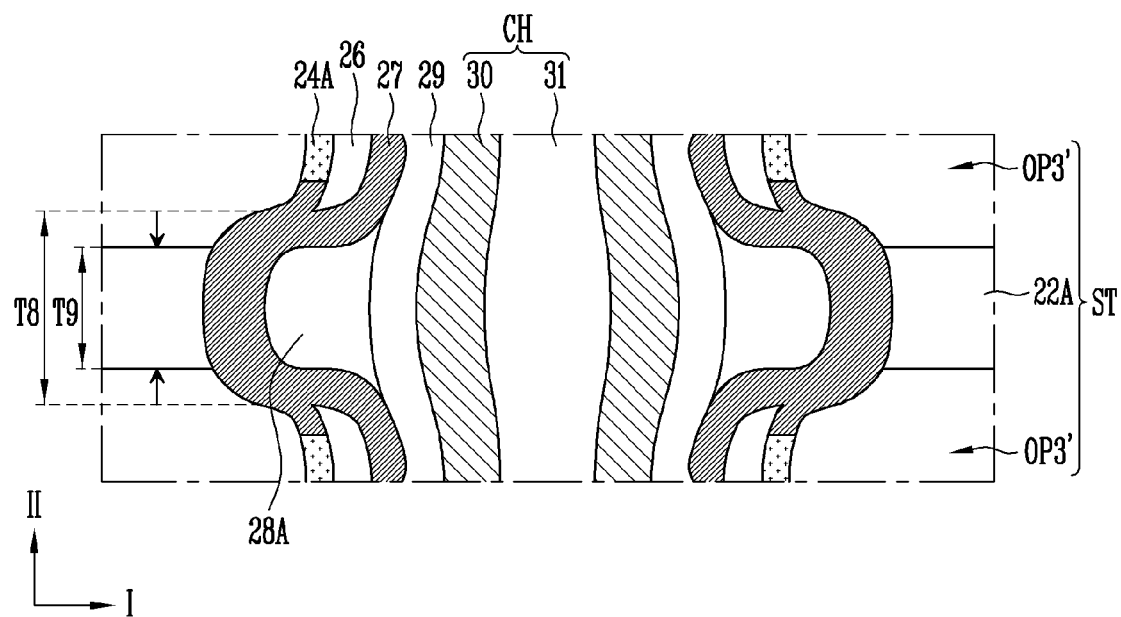
Figure 2N:
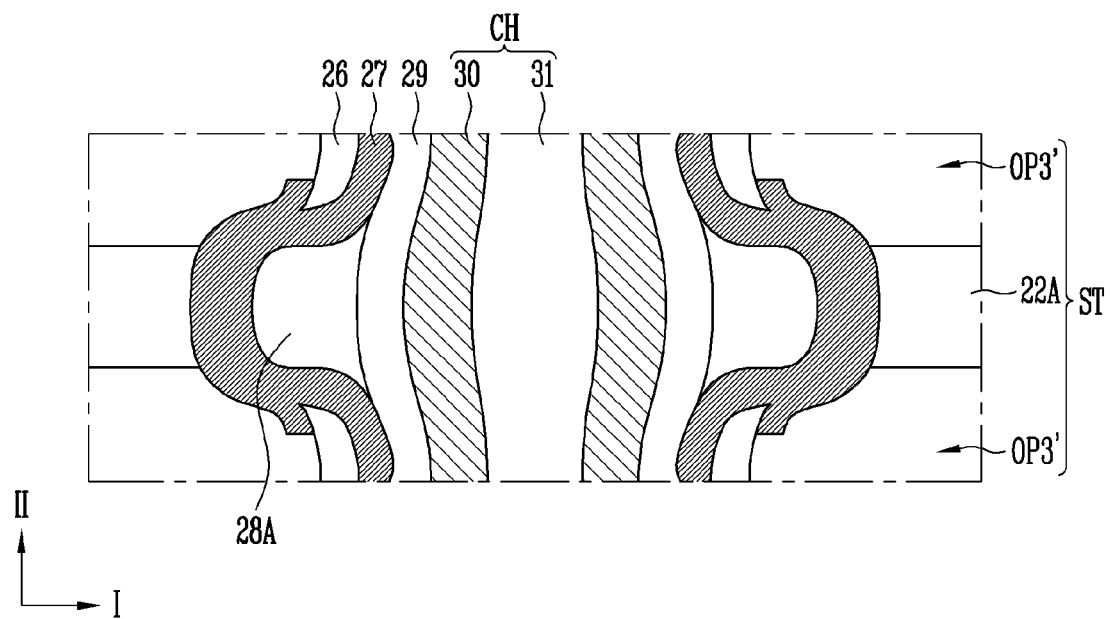
Figure 2O:
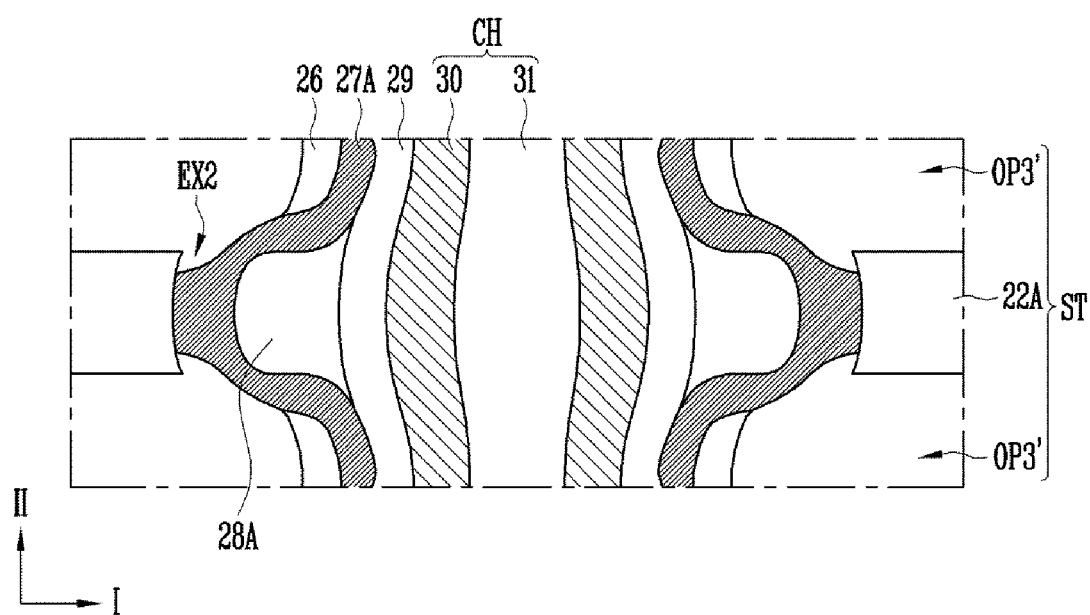
Figure 2P:
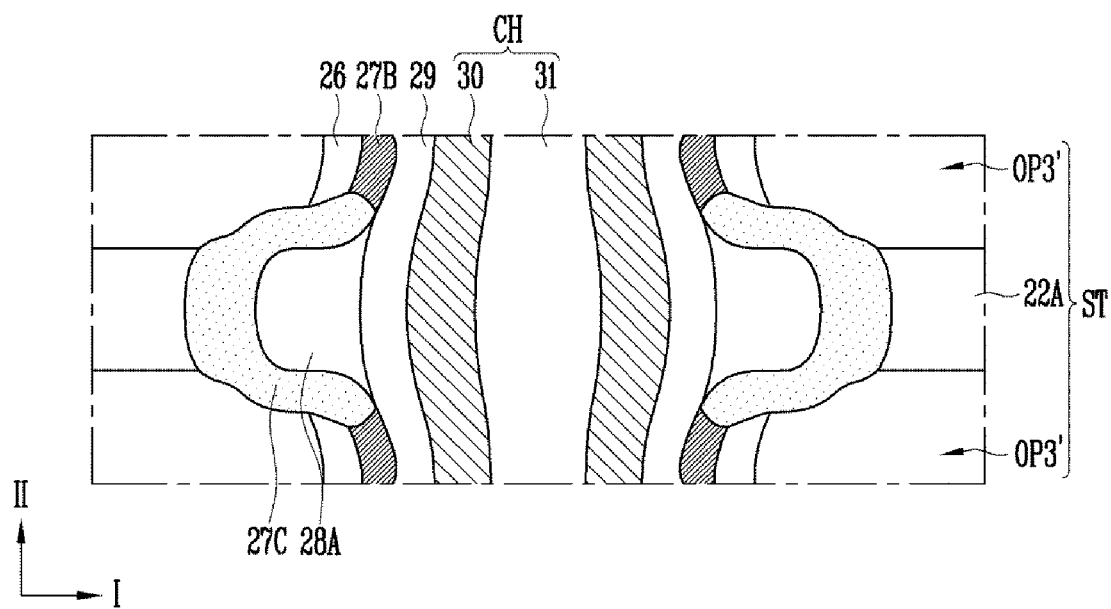
Figure 2Q:
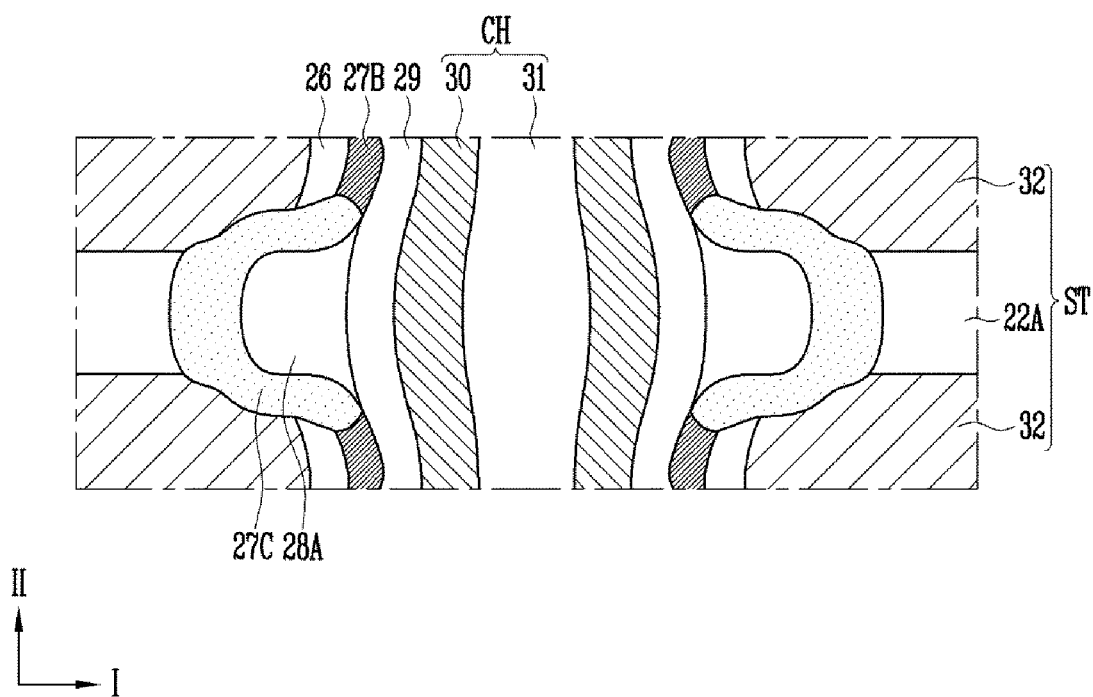

FIGS. 2A to 2Q are views illustrating a manufacturing method of the semiconductor device in accordance with an embodiment of the present disclosure. Hereinafter, descriptions of contents overlapping with those described above will be omitted.

Referring to FIG. 2A, a stack structure ST is formed. The stack structure ST may include first sacrificial layers 21 and insulating layers 22, which are alternately stacked. The first sacrificial layers 21 and the insulating layers 22 may be stacked in a second direction II. The first sacrificial layers 21 may include a material having a high etch selectivity with respect to the insulating layers 22. In an example, the first sacrificial layers 21 may include a sacrificial material such as nitride, and the insulating layers 22 may include an insulating material such as oxide.

Subsequently, a first opening OP1 is formed, which penetrates the stack structure. The first opening OP1 may be formed by etching the first sacrificial layers 21 and the insulating layers 22. The first opening OP1 may expand in the second direction II. The first opening OP1 may have a width W1 defined by sidewalls, i.e., etched surfaces of the first sacrificial layers 21. The first openings OP1 may have a section having a circular shape, an elliptical shape, a polygonal shape, etc.

Subsequently, second openings OP2 are formed by selectively etching the insulating layers 22. The first sacrificial layers 21 may protrude farther to the inside of the first opening OP1 than the insulating layers 22. The second openings OP2 may be located between the protruding first sacrificial layers 21. Sidewalls of the insulating layers 22 may be newly defined through an etching process, and the sidewall may include a curved surface.

Subsequently, first protective patterns 23 are formed on the first sacrificial layers 21. The first protective patterns 23 may be formed by using an oxidation process. The first protective patterns 23 may include a material having a high etch selectivity with respect to the first sacrificial layers 21. The first sacrificial layers 21 may include nitride, and the first protective patterns 23 may include oxide.

The first protective patterns 23 may be respectively formed on the first sacrificial layers 21, and be isolated from each other. Sidewalls of the first sacrificial layers 21 may be newly defined through an oxidation process. Corners of the first sacrificial layers 21, which are in contact with the insulating layers 22, may be rounded in the oxidation process. Each of the first protective patterns 23 may include an end portion EP1 having the shape of a curved tail to surround the corner of each of the first sacrificial layers 21.

Referring to FIG. 2B, a second protective layer 24 is formed in the first opening OP1 and the second openings OP2. The second protective layer 24 may be formed by using a deposition process. The second protective layer 24 may be formed along surfaces of the first protective patterns 23 and the insulating layers 22. The second protective layer 24 may include corner portions E surrounding the ends EP1 of the first protective patterns 23. The corner portions E may be located at portions at which the first opening OP1 and the second openings OP2 are connected to each other.

The second protective layer 24 may include a material having a high etch selectivity with respect to the first protective patterns 23. The second protective layer 24 may include a material having a high etch selectivity with respect to the insulating layers 22. The first protective patterns 23 and the insulating layers 22 may include oxide, and the second protective layer 24 may include poly-silicon.

The second protective layer 24 may be formed to have a thickness with which the second protective layer 24 fills a portion of the first opening OP1 and fills a portion of each of the second openings OP2. The second protective layer 24 may be formed to have a thickness thicker than that of the first protective patterns 23 (T2>T1).

Referring to FIG. 2C, a second sacrificial layer 25 is formed in the second protective layer 24. The second sacrificial layer 25 may include a material having a high etch selectivity with respect to the second protective layer 24. The second protective layer 24 may include poly-silicon, and the second sacrificial layer 25 may include nitride.

The second sacrificial layer 25 may be formed by using a deposition process, and be formed along a surface of the second protective layer 24. The second sacrificial layer 25 may be formed to have a thickness thicker than those of the first protective patterns 23 and the second protective layer 24 (T3>T1, T2). The second sacrificial layer 25 may be formed to have a thickness with which the second sacrificial layer 25 fills the second openings OP2 and fills a portion of the first opening OP1.

Referring to FIG. 2D, second sacrificial patterns 25A are formed. The second sacrificial patterns 25A may be formed by etching the second sacrificial layer 25. The second sacrificial patterns 25A may be respectively located in the second openings OP2, and be isolated from each other.

Portions of the second protective layer 24, which correspond to the insulating layers 22, may be covered by the second sacrificial patterns 25A, and portions of the second protective layer 24, which correspond to the first sacrificial layer 21, are not covered by the second sacrificial patterns 25A but may be exposed.

Referring to FIG. 2E, blocking patterns 26 are formed. The blocking patterns 26 may be formed by using an oxidation process. The blocking patterns 26 may be formed by partially oxidizing the second protective layer 24. Portions of the second protective layer 24, which are exposed by the second sacrificial patterns 25, may be oxidized. The blocking patterns 26 may include oxide.

Interfaces between the second protective layer 24 and the blocking patterns 26 may be newly defined through an oxidation process. Accordingly, positions of corner portions E' may be newly defined. The corner portions E' may be surrounded by the blocking patterns 26 or the second sacrificial patterns 25A. Each of the blocking patterns 26 may include an end portion EP2 having the shape of a curved tail to surround each of the corner portions E'. The blocking patterns 26 may have a thickness thicker than that of the first protective patterns 23 or the second protective layer 24 (T4>T1, T2).

Referring to FIG. 2F, the second sacrificial patterns 25A are removed. The second sacrificial patterns 25A may be removed by selectively etching the second sacrificial patterns 25A. Accordingly, the portions of the protective layer 24, which correspond to the insulating layers 22, are exposed.

Referring to FIG. 2G, second protective patterns 24A are formed. The second protective patterns 24A may be respectively interposed between the first protective patterns 23 and the blocking patterns 26. The second protective patterns 24A may be formed by selectively etching the second protective layer 24. Accordingly, the second openings OP2 may be again opened.

Portions of the second protective layer 24, which are exposed by the blocking patterns 26, may be etched, and portions of the second protective layer 24, which are covered by the blocking patterns 26, may remain. The remaining portions may become the second protective patterns 24A. When the second protective layer 24 is etched, a portion interposed between the end portion EP1 of each of the first protective patterns 23 and an end portion EP2 of each of the blocking patterns 26 may be etched. Therefore, the second opening OP2 may be expanded between the first protective patterns 23 and the blocking patterns 26, and include an expansion portion EX1.

The width of the first opening OP1 is decreased by the first protective patterns 23, the second protective patterns 24A, and the blocking patterns 26, which are formed on the first sacrificial layers 21. The first opening OP1 has a width W2 decreased from regions corresponding to the first sacrificial layers 21. When it is considered that memory cells are located at portions corresponding to the first sacrificial layers 21 in a final structure, the portions corresponding to the first sacrificial layers 21 may correspond to a memory cell region, and portions corresponding to the insulating layers 22 may correspond to a space region between the stacked memory cells. Therefore, a width of the memory cell region in the first opening OP1 may be selectively decreased by the first protective patterns 23, the second protective patterns 24A, and the blocking patterns 26. In addition, because the memory cell region of the first opening OP1 has a second width W2, an effect as if the first opening OP1 is formed to have the second width W2 can be derived.

Referring to FIG. 2H, a data storage layer 27 is formed in the first opening OP1 and the second openings OP2. The data storage layer may be formed to fill the expansion portion EX1. The data storage layer 27 may be formed by using a deposition process, and be formed along surfaces of the blocking patterns 26, the second protective patterns 24A, the first protective patterns 23, and the insulating layers 22. On a section defined by a first direction I and the second direction II, the data storage layer 27 may be formed in a curve shape. The data storage layer 27 may be formed in a shape in which portions of the data storage layer 27, which correspond to the first sacrificial layer 21, protrude farther to the inside of the first opening OP1 than portions of the data storage layer 27, which correspond to the insulating layers 22.

Portions of the data storage layer 27, which correspond to the first sacrificial layers 21, i.e., portions corresponding to the memory cell region are used as a substantial data storage. Thus, an effect as if the data storage layer 27 is formed in the first opening having the second width W2 can be derived.

The data storage layer 27 may be formed to have a thickness with which the data storage layer 27 fills a portion of the first opening OP1 and partially fill each of the second openings OP2. The data storage layer 27 may have a thickness thicker than that of the first protective patterns 23 or the second protective patterns 24A (T5>T1, T2). The data storage layer 27 may have a thickness thinner than that of the blocking patterns 26 (T5<T4).

Referring to FIG. 2I, an insulating layer 28 is formed in the first opening OP1 and the second openings OP2. The insulating layer 28 may be formed to have a thickness with which the insulating layer 28 fills the second openings OP2. The insulating layer 28 may completely fill the first opening OP1 or partially fill the first opening OP1.

Referring to FIG. 2J, insulating patterns 28 are formed. The insulating patterns 28A respectively located in the second openings OP2 may be formed by etching the insulating layer 28. Portions of the data storage layer 27, which correspond to the insulating layers 22 may be covered by the insulating patterns 28A. Portions of the data storage layer 27, which correspond to the first sacrificial layers 21, are not covered by the insulating patterns 28A but may be exposed in the first opening OP1.

Referring to FIG. 2K, a tunnel insulating layer 29 is formed in the first opening OP1. The tunnel insulating layer 29 may be formed by using a deposition process, and be formed along surfaces of the data storage layer 27 and the insulating patterns 28A.

The tunnel insulating layer 29 may have a thickness thicker than that of the first protective patterns 23 (T6>T1). The tunnel insulating layer 29 may have a thickness thinner than that of the blocking patterns 26 or the second protective patterns 24A (T6<T4, T2). The tunnel insulating layer 29 may have the substantially same thickness as the data storage layer 27 (T5=T6) or have different thicknesses (T5≠T6). The tunnel insulating layer 29 may be formed to have a thickness with which the tunnel insulating layer 29 partially fills the first opening OP1.

Subsequently, a channel structure CH is formed in the first opening OP1. The channel structure CH may include a channel layer 30, and further include a gap fill layer 31. The channel layer 30 may be formed by using a deposition process, and be formed along a surface of the tunnel insulating layer 29. The channel layer 30 may have a thickness thicker than that of the first protective patterns 23, the second protective patterns 24A, the blocking patterns 26, the data storage layer 27, or the tunnel insulating layer 29 (T7>T1, T2, T4, T5, T6). The gap fill layer 31 may be formed in the channel layer 30, and include a void.

Referring to FIG. 2L, third openings OP3 are formed by removing the first sacrificial layers 21. After a slit (not shown) penetrating the stack structure ST is formed, the third openings OP3 may be formed by selectively etching the first sacrificial layers 21 through the slit. The first protective patterns 23 may be exposed through the third openings OP3. When the first sacrificial layers 21 are removed, the data storage layer 27 may be protected by the first protective patterns 23 and the second protective patterns 24A.

Referring to FIG. 2M, the data storage layer 27 is partially exposed. The third openings OP3 are expanded by etching the insulating layers 22. The insulating layers 22 may be etched by using an isotropic etching process. The isotropic etching process may be a wet etching process. The etched insulating layers 22A may have a thickness thinner than that of the insulating layers 22 (T9<T8). The etched insulating layers 22A may have a width defined in the first direction I, and the width of the etched insulating layers 22A may also be decreased due to the etching process.

When the insulating layers 22A are etched, the first protective patterns 23 may be etched together with the insulating layers 22A. Therefore, the second protective patterns 24A may be exposed through the expanded third opening OP3'. In addition, the data storage layer 27 may be partially exposed through the expanded third opening OP3'.

Referring to FIG. 2N, the second protective patterns 24A are removed. The second protective patterns 24A may be removed by using a stripping process. Accordingly, the third openings OP3' are further expanded. The data storage layer 27 may be further exposed through the exposed third openings OP3'. In addition, the blocking patterns 26 may be exposed through the exposed third openings OP3'. The end portion of each of the blocking patterns 26 may be covered by the data storage layer 27, and only the other portion may be exposed.

Referring to FIG. 2O, the data storage layer 27 is etched through the third openings OP3'. Accordingly, the third openings OP3' are further expanded. The data storage layer 27 may be etched by using an isotropic etching process. The isotropic etching process may be a wet etching process. Portions of the data storage layer 27, which are exposed through the third openings OP3', may be etched through the etching process. A portion of the data storage layer 27, which covers the blocking patterns 26, may be etched. In addition, a portion of the data storage layer 27, which is in contact with the insulating layers 22A, may be etched. Therefore, the blocking patterns 26 may be further exposed by the expanded third openings OP3'. In addition, the third openings OP3' may be expanded between the etched data storage layer 27A and the insulating layers 22A, and each of the third openings OP3' may include an expansion portion EX2.

Referring to FIG. 2P, insulative liners 27C are formed by partially oxidizing the data storage layer 27A. Portions of the data storage layer 27A, which are exposed through the third openings OP3', may be oxidized. A portion of the data storage layer 27A, which is exposed between the blocking patterns 26 and the insulating layers 22A, may be oxidized.

The insulative liners 27C may have a shape in which the insulative liners 27C respectively surround the insulating patterns 28A. Each of the insulative liners 27C may be interposed between the insulating layers 22A and the insulating patterns 28A. Also, each of the insulative liners 27C may be expanded along a surface of each of the insulating patterns 28A. Each of the insulative liners 27C may be expanded between the blocking patterns 26 and the insulating patterns 28A and between data storage patterns 27B and the insulating patterns 28A.

Portions of the data storage layer 27A, which are covered by the blocking patterns 26, are not oxidized but may remain. The remaining portions may be the data storage patterns 27B. Interfaces between the data storage patterns 27B and the insulative liners 27C may be defined through an oxidation process. The interface may include a curved surface.

Referring to FIG. 2Q, conductive layers 32 are formed in the third openings OP3'. Because the conductive layers 32 are formed in the expanded third openings OP3', gap fill characteristics of the conductive layers 32 can be improved as compared with the existing conductive layers. Further, because the thickness of the conductive layers 32 increases, the resistance of the conductive layers 32 can decrease.

The conductive layers 32 may be in contact with the insulative liners 27C. The insulative liners 27C may be interposed between the conductive layers 32 and the insulating patterns 28A. The conductive layers 32 may include a metal such as tungsten.

According to the manufacturing method described above, the thickness of the data storage patterns 27B is determined according to the deposition thickness of the data storage layer 27, a change in thickness of the data storage patterns 27B due to a process variable can be minimized. In addition, the data storage patterns 27B are formed by partially oxidizing the data storage layer 27A. Thus, it is unnecessary to etch the data storage layer 27A so as to isolate the data storage patterns 27B from each other, and the data storage patterns 27B can be prevented from being damaged in an etching process.

Conventionally, a process of expanding the first opening OP1 in a region corresponding to the first sacrificial layers 21 was used so as to isolate the data storage patterns 27B from each other. According to this process, a chip size increases as the first opening OP1 is expanded. On the other hand, in accordance with the embodiment of the present disclosure, the data storage layer 27 is formed by inwardly narrowing the first opening OP1, so that the degree of integration can be improved as compared with the conventional process. Further, an effect as if the width W2 of the first opening OP1 decreases can be derived, and thus a program or erase speed can be increased as compared with the conventional process.

Figure 3:
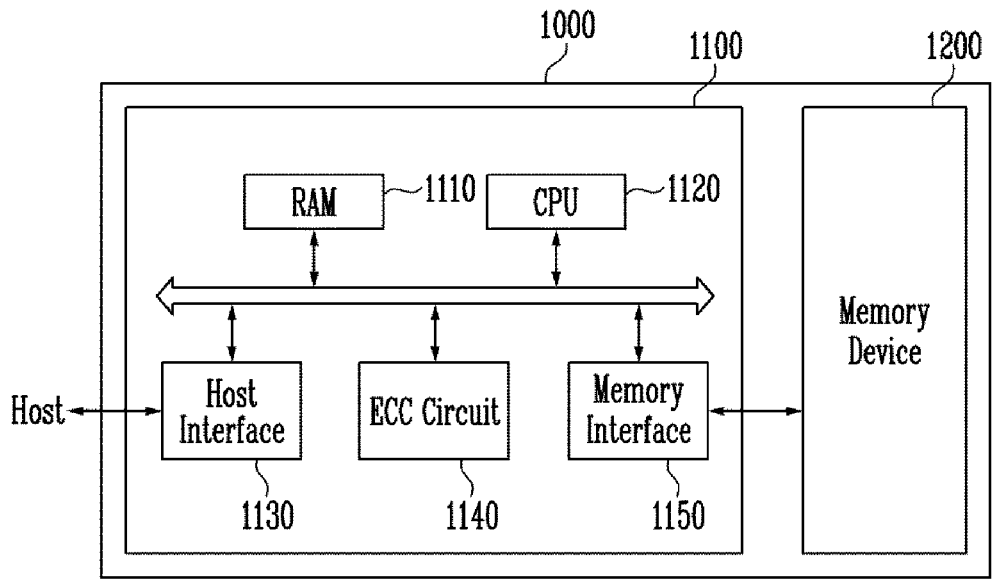
FIG. 3 is a block diagram illustrating a configuration of a memory system in accordance with an embodiment of the present disclosure.

FIG. 3 is a block diagram illustrating a configuration of a memory system 1000 in accordance with an embodiment of the present disclosure.

Referring to FIG. 3, the memory system 1000 includes a memory device 1200 and a controller 1100.

The memory device 1200 is used to store data information having various data formats such as texts, graphics, and software codes. The memory device 1200 may be a nonvolatile memory. Also, the memory device 1200 may have the structure described with reference to FIGS. 1A to 2Q, and be manufactured according to the manufacturing method described with reference to FIGS. 1A to 2Q. In an embodiment, the memory device 1200 may include: a stack structure including insulating layers and conductive layers, which are alternately stacked; a channel structure penetrating the stack structure; data storage patterns respectively interposed between the conductive layers and the channel structure; blocking patterns respectively interposed between the conductive layers and the data storage patterns; insulating patterns respectively interposed between the insulating layers and the channel structure; and insulative liners interposed between the insulating layers and the insulating patterns, the insulative liners respectively surrounding the insulating patterns. The structure and manufacturing method of the memory device 1200 are the same as described above, and therefore, their detailed descriptions will be omitted.

The controller 1100 is connected to a host and the memory device 1200, and accesses the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. The RAM 1110 may be replaced with a static random access memory (SRAM), a read only memory (ROM), etc.

The CPU 1120 controls overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes a NAND interface or NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with the embodiment of the present disclosure includes the memory device 1200 having an improved degree of integration and improved characteristics, and thus the degree of integration and characteristics of the memory system 1000 can be improved.

Figure 4:
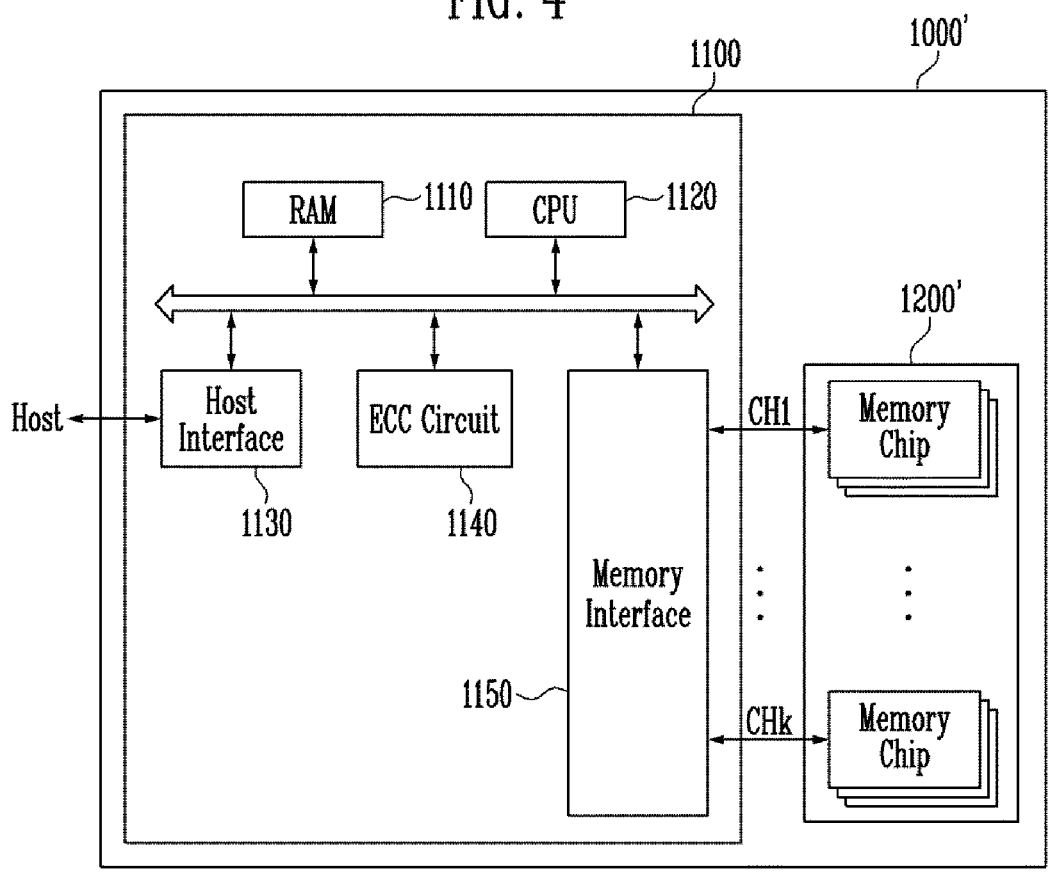
FIG. 4 is a block diagram illustrating a configuration of a memory system in accordance with an embodiment of the present disclosure.

FIG. 4 is a block diagram illustrating a configuration of a memory system 1000' in accordance with an embodiment of the present disclosure. Hereinafter, descriptions of contents overlapping with those described above will be omitted.

Referring to FIG. 4, the memory system 1000' includes a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structure described with reference to FIGS. 1A to 2Q, and be manufactured according to the manufacturing method described with reference to FIGS. 1A to 2Q. In an embodiment, the memory device 1200' may include: a stack structure including insulating layers and conductive layers, which are alternately stacked; a channel structure penetrating the stack structure; data storage patterns respectively interposed between the conductive layers and the channel structure; blocking patterns respectively interposed between the conductive layers and the data storage patterns; insulating patterns respectively interposed between the insulating layers and the channel structure; and insulative liners interposed between the insulating layers and the insulating patterns, the insulative liners respectively surrounding the insulating patterns. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with the embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 5:
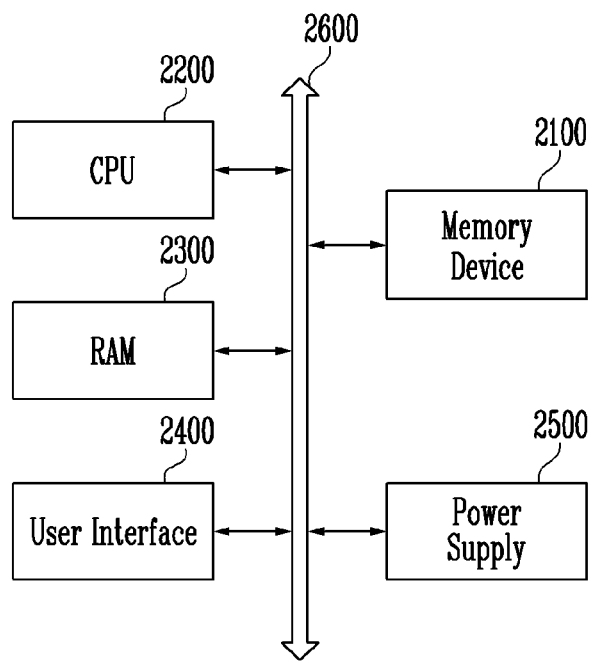
FIG. 5 is a block diagram illustrating a configuration of a computing system in accordance with an embodiment of the present disclosure.

FIG. 5 is a block diagram illustrating a configuration of a computing system 2000 in accordance with an embodiment of the present disclosure. Hereinafter, descriptions of contents overlapping with those described above will be omitted.

Referring to FIG. 5, the computing system 2000 includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. The memory device 2100 may have the structure described with reference to FIGS. 1A to 2Q, and be manufactured according to the manufacturing method described with reference to FIGS. 1A to 2Q. In an embodiment, the memory device 2100 may include: a stack structure including insulating layers and conductive layers, which are alternately stacked; a channel structure penetrating the stack structure; data storage patterns respectively interposed between the conductive layers and the channel structure; blocking patterns respectively interposed between the conductive layers and the data storage patterns; insulating patterns respectively interposed between the insulating layers and the channel structure; and insulative liners interposed between the insulating layers and the insulating patterns, the insulative liners respectively surrounding the insulating patterns. The structure and manufacturing method of the memory device 2100 are the same as described above, and therefore, their detailed descriptions will be omitted.

The memory device 2100 may be a multi-chip package including a plurality of memory chips as described with reference to FIG. 4.

The computing system 2000 configured as described above may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with the embodiment of the present disclosure includes the memory device 2100 having an improved degree of integration and improved characteristics, and thus characteristics of the computing system 2000 can also be improved.

Figure 6:
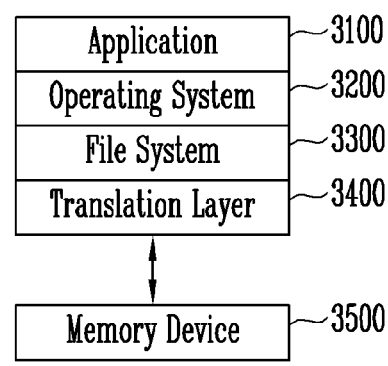
FIG. 6 is a block diagram illustrating a configuration of a computing system in accordance with an embodiment of the present disclosure.

FIG. 6 is a block diagram illustrating a configuration of a computing system 3000 in accordance with an embodiment of the present disclosure.

Referring to FIG. 6, the computing system 3000 includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. The memory device 3500 may have the structure described with reference to FIGS. 1A to 2Q, and be manufactured according to the manufacturing method described with reference to FIGS. 1A to 2Q. In an embodiment, the memory device 3500 may include: a stack structure including insulating layers and conductive layers, which are alternately stacked; a channel structure penetrating the stack structure; data storage patterns respectively interposed between the conductive layers and the channel structure; blocking patterns respectively interposed between the conductive layers and the data storage patterns; insulating patterns respectively interposed between the insulating layers and the channel structure; and insulative liners interposed between the insulating layers and the insulating patterns, the insulative liners respectively surrounding the insulating patterns. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with the embodiment of the present disclosure includes the memory device 3500 having an improved degree of integration and improved characteristics, and thus characteristics of the computing system 3000 can also be improved.

In accordance with the present disclosure, there can be provided a semiconductor device having a stable structure and improved reliability.

The embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood to have by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor device, the method comprising:
    forming a stack structure including first sacrificial layers and insulating layers, which are alternately stacked;
    forming a first opening penetrating the stack structure;
    forming second openings by etching the insulating layers;
    forming protective patterns on the first sacrificial layers;
    forming a data storage layer in the first opening and the second openings;
    forming insulating patterns in the second openings;
    forming a channel structure in the first opening;
    forming third openings exposing the protective patterns by selectively removing the first sacrificial layers;
    removing the protective patterns to partially expose the data storage layer;
    etching the insulating layers through the third openings; and
    forming insulative liners respectively surrounding the insulating patterns by partially oxidizing the data storage layer through the third openings.

2. The method of claim 1, further comprising forming conductive layers in the third openings, after the insulative liners are formed.

3. The method of claim 1, wherein, when the first sacrificial layers are removed, the data storage layer is protected by protective patterns.

4. The method of claim 1, wherein forming the third openings includes etching the protective patterns and the insulating layers.

5. The method of claim 1, wherein forming the protective patterns includes:
    forming first protective patterns by oxidizing the first sacrificial layers; and
    forming second protective patterns on the first protective patterns.

6. The method of claim 5, wherein the second protective patterns include a material having an etch selectivity with respect to the first protective patterns.

7. The method of claim 1, further comprising respectively forming blocking patterns on the protective patterns, before the data storage layer is formed.

8. The method of claim 7, wherein forming the blocking patterns includes:
    forming a second protective layer in the first opening and the second openings;
    forming second sacrificial patterns in the second openings; and
    forming the blocking patterns by oxidizing the second protective layer exposed by the second sacrificial patterns.

9. The method of claim 8, further comprising:
    removing the second sacrificial patterns, after the blocking patterns are formed; and
    forming second protective patterns interposed between the first sacrificial layers and the blocking patterns by etching the second protective layer exposed by the blocking patterns.

10. The method of claim 7, wherein forming the insulative liners includes oxidizing the data storage layer exposed between the blocking patterns and the insulating layers.

11. The method of claim 1, further comprising etching the data storage layer exposed through the third openings, before the insulative liners are formed.

12. A method of manufacturing a semiconductor device, the method comprising:
    forming a stack structure including first sacrificial layers and insulating layers, which are alternately stacked;
    forming a first opening penetrating the stack structure;
    forming second openings by etching the insulating layers;
    forming a protective layer in the first opening and the second openings;
    forming second sacrificial patterns in the second openings;
    forming blocking patterns on the first sacrificial layers by oxidizing the protective layer exposed by the second sacrificial patterns;
    forming a data storage layer in the first opening and the second openings;
    forming insulating patterns in the second openings;
    forming a channel structure in the first opening;
    forming third openings by selectively removing the first sacrificial layers;
    etching the insulating layers to partially expose the data storage layer through the third openings; and
    forming insulative liners respectively surrounding the insulating patterns by partially oxidizing the data storage layer through the third openings.

13. The method of claim 12, further comprising forming conductive layers in the third openings.

14. The method of claim 12, further comprising etching the data storage layer exposed through the third openings, before the insulative liners are formed.

15. The method of claim 12, wherein forming the insulative liners includes using the blocking patterns to cover unoxidized portions of the data storage layer.

16. The method of claim 12, wherein forming the insulative liners includes oxidizing portions interposed between the insulating layers and the insulating patterns.

17. The method of claim 12, further comprising:
   removing the second sacrificial patterns, after the blocking patterns are formed; and
   forming protective patterns interposed between the first sacrificial layers and the blocking patterns by etching the protective layer exposed by the blocking patterns.

* * * * *